United States Patent
Cech et al.

(10) Patent No.: US 9,112,318 B2
(45) Date of Patent: Aug. 18, 2015

(54) MODULAR CONTROL APPARATUS

(71) Applicant: Pilz GmbH & Co. KG, Ostfildern (DE)

(72) Inventors: Markus Cech, Ostfildern (DE); Andreas Veit, Ostfildern (DE); Patrick Hewer, Ostfildern (DE); Thorsten Godau, Ostfildern (DE)

(73) Assignee: PILZ GMBH & CO. KG, Ostfildern (DE)

( * ) Notice: Subject to any disclaimer, the term of this patent is extended or adjusted under 35 U.S.C. 154(b) by 21 days.

(21) Appl. No.: 14/175,607

(22) Filed: Feb. 7, 2014

(65) Prior Publication Data

US 2014/0194007 A1  Jul. 10, 2014

Related U.S. Application Data

(63) Continuation of application No. PCT/EP2012/064683, filed on Jul. 26, 2012.

(30) Foreign Application Priority Data

Aug. 9, 2011  (DE) .......................... 10 2011 110 184

(51) Int. Cl.
*H01R 13/629* (2006.01)
*H01R 12/72* (2011.01)
(Continued)

(52) U.S. Cl.
CPC ............ *H01R 12/721* (2013.01); *H01R 9/2675* (2013.01); *H01R 12/7005* (2013.01); *H05K 7/1477* (2013.01)

(58) Field of Classification Search
CPC ............... H01R 13/629; H01R 13/193; H01R 23/7068; H01R 13/6485
See application file for complete search history.

(56) References Cited

U.S. PATENT DOCUMENTS 3,969,796 A  *  7/1976  Hodsdon et al. ................. 24/270
4,257,665 A  *  3/1981  John et al. ..................... 439/341
(Continued)

FOREIGN PATENT DOCUMENTS

DE  40 13 999 A1  11/1991
DE  195 24 123 C1  2/1997
(Continued)

OTHER PUBLICATIONS

System Description No. 21256-EN-04; Pilz GmbH & Co. KG; 2010; 89 pp.

(Continued)

*Primary Examiner* — Gary Paumen
(74) *Attorney, Agent, or Firm* — Harness, Dickey & Pierce, P.L.C.

(57) ABSTRACT

A control apparatus has a module having first and second module parts, which can be mechanically and electrically combined to form a combined arrangement. The first and second module parts each comprise a housing having a boundary surface opposite one another in the combined arrangement that define a boundary plane. The first and second module parts are combined by a pivoting movement about a pivot axis arranged perpendicular to the boundary plane. One of the module parts has a number of contacts comprising a first electrical contact, and the other module part has a number of mating contacts comprising a first electrical mating contact. In the combined arrangement, each electrical contact makes contact with its corresponding mating contact for electrical connection between the first and second module parts. The contacts comprise conductor tracks on a nonconductive board such that a printed circuit board is formed.

14 Claims, 12 Drawing Sheets

(51) Int. Cl.
  *H01R 9/26* (2006.01)
  *H05K 7/14* (2006.01)
  *H01R 12/70* (2011.01)

(56) References Cited

U.S. PATENT DOCUMENTS

| | | | |
|---|---|---|---|
| 4,738,632 A * | 4/1988 | Schmidt et al. | 439/341 |
| 5,032,087 A * | 7/1991 | Koiner et al. | 439/341 |
| 5,253,140 A | 10/1993 | Inoue et al. | |
| 5,273,462 A * | 12/1993 | Huser et al. | 439/681 |
| 5,302,136 A * | 4/1994 | St. Germain et al. | 439/376 |
| 5,458,497 A * | 10/1995 | Yasumura et al. | 439/62 |
| 5,966,023 A * | 10/1999 | Burgers et al. | 324/750.25 |
| 6,155,860 A * | 12/2000 | Lemke et al. | 439/341 |
| 6,350,141 B1 * | 2/2002 | Houtz | 439/341 |
| 6,422,888 B1 * | 7/2002 | Goble | 439/341 |
| 6,676,430 B1 * | 1/2004 | Conorich | 439/341 |
| 6,796,813 B1 * | 9/2004 | L'Hermet | 439/131 |
| 7,118,402 B2 * | 10/2006 | Takada | 439/341 |
| 7,722,377 B2 | 5/2010 | Moore | 439/341 |
| 8,011,936 B2 * | 9/2011 | Goto | 439/76.1 |
| 8,986,033 B2 * | 3/2015 | Berger et al. | 439/341 |
| 2006/0057883 A1 | 3/2006 | Fasce et al. | |
| 2012/0100741 A1 * | 4/2012 | Moore | 439/341 |

FOREIGN PATENT DOCUMENTS

| | | |
|---|---|---|
| DE | 297 13 960 U1 | 1/1998 |
| DE | 197 02 233 A1 | 7/1998 |
| DE | 102 16 414 C1 | 12/2003 |
| DE | 10 2004 020 995 A1 | 11/2005 |
| DE | 20 2006 006 659 U1 | 8/2006 |
| DE | 20 2010 004 408 U1 | 5/2011 |
| EP | 0 909 122 A2 | 4/1999 |
| WO | 2012/000808 A1 | 1/2012 |

OTHER PUBLICATIONS

ISA/EP; International Search Report for PCT/EP2012/064683; mailed Oct. 30, 2012; 3 pp.
ISA/EP; English language translation of International Preliminary Report on Patentability (Chapter 1); issued by WIPO Feb. 11, 2014; 8 pp.
X20 System User Manual Part 1; May 2009; 81 pp.
X20 System User Manual Part 2; May 2009; 61 pp.
X20 System User Manual Part 3; May 2009; 102 pp.
X20 System User Manual Part 4; May 2009; 194 pp.
X20 System User Manual Part 5; May 2009; 284 pp.
X20 System User Manual Part 6; May 2009; 249 pp.
X20 System User Manual Part 7; May 2009; 118 pp.
X20 System User Manual Part 8; May 2009; 113 pp.

* cited by examiner

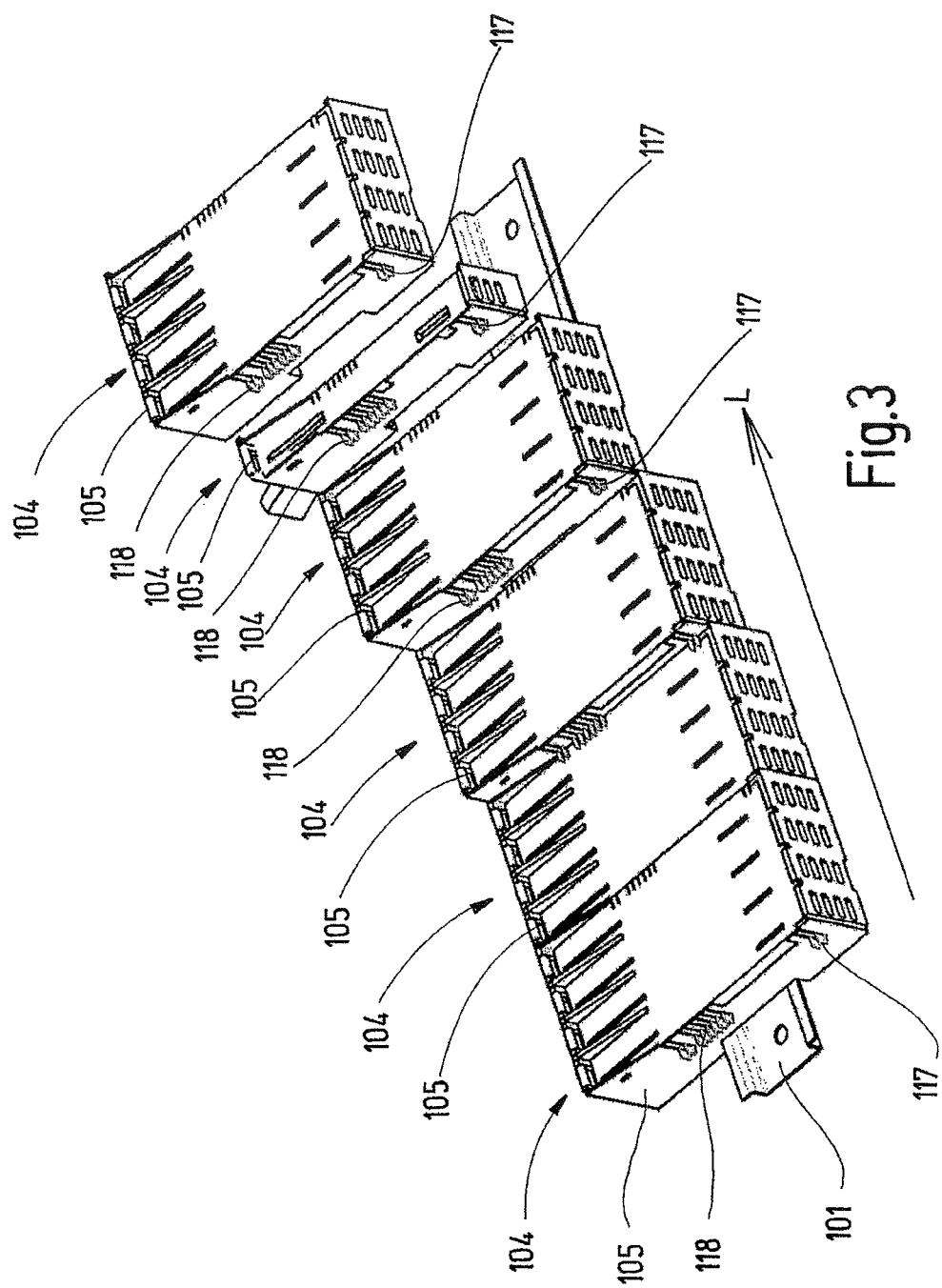

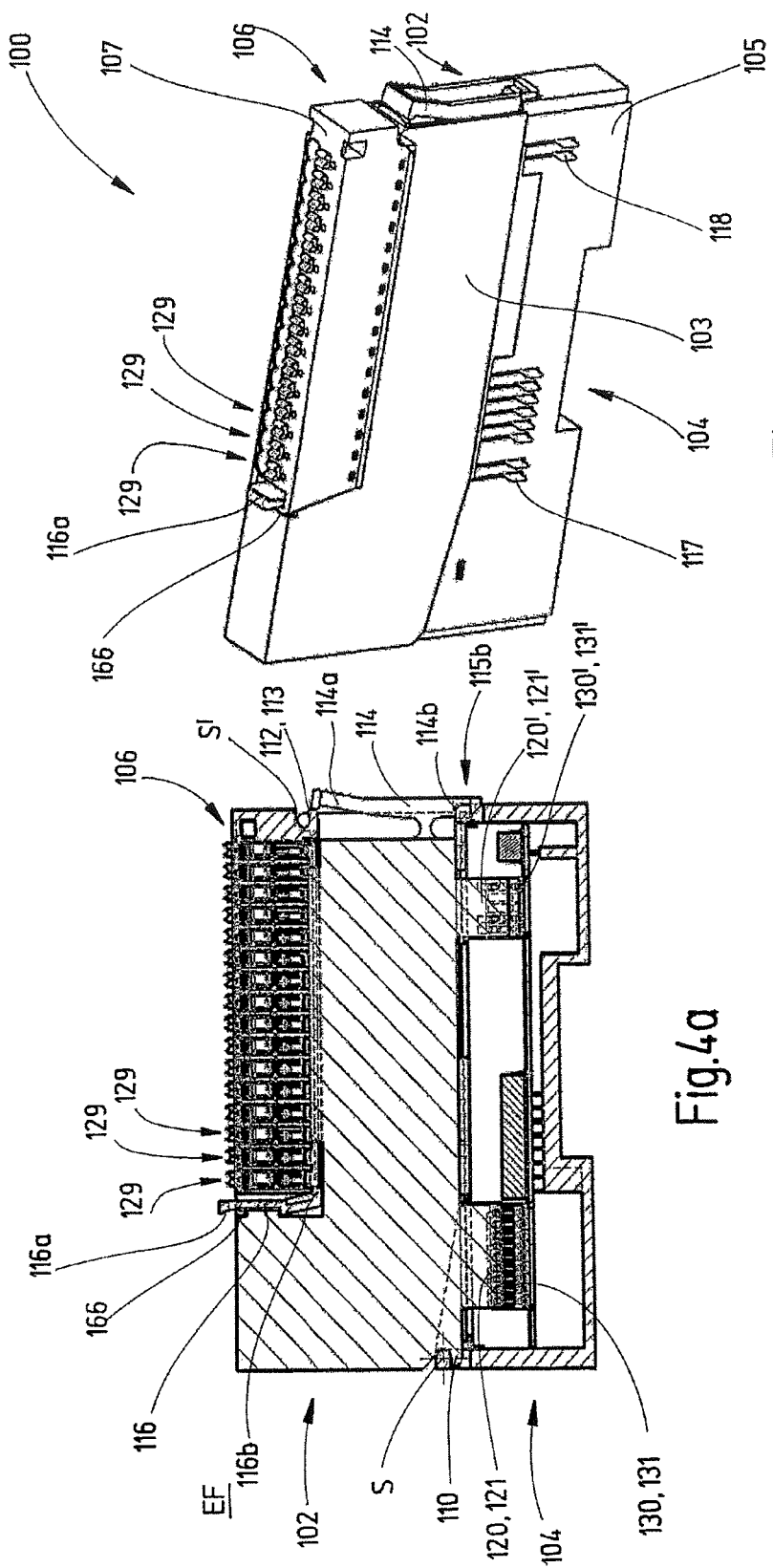

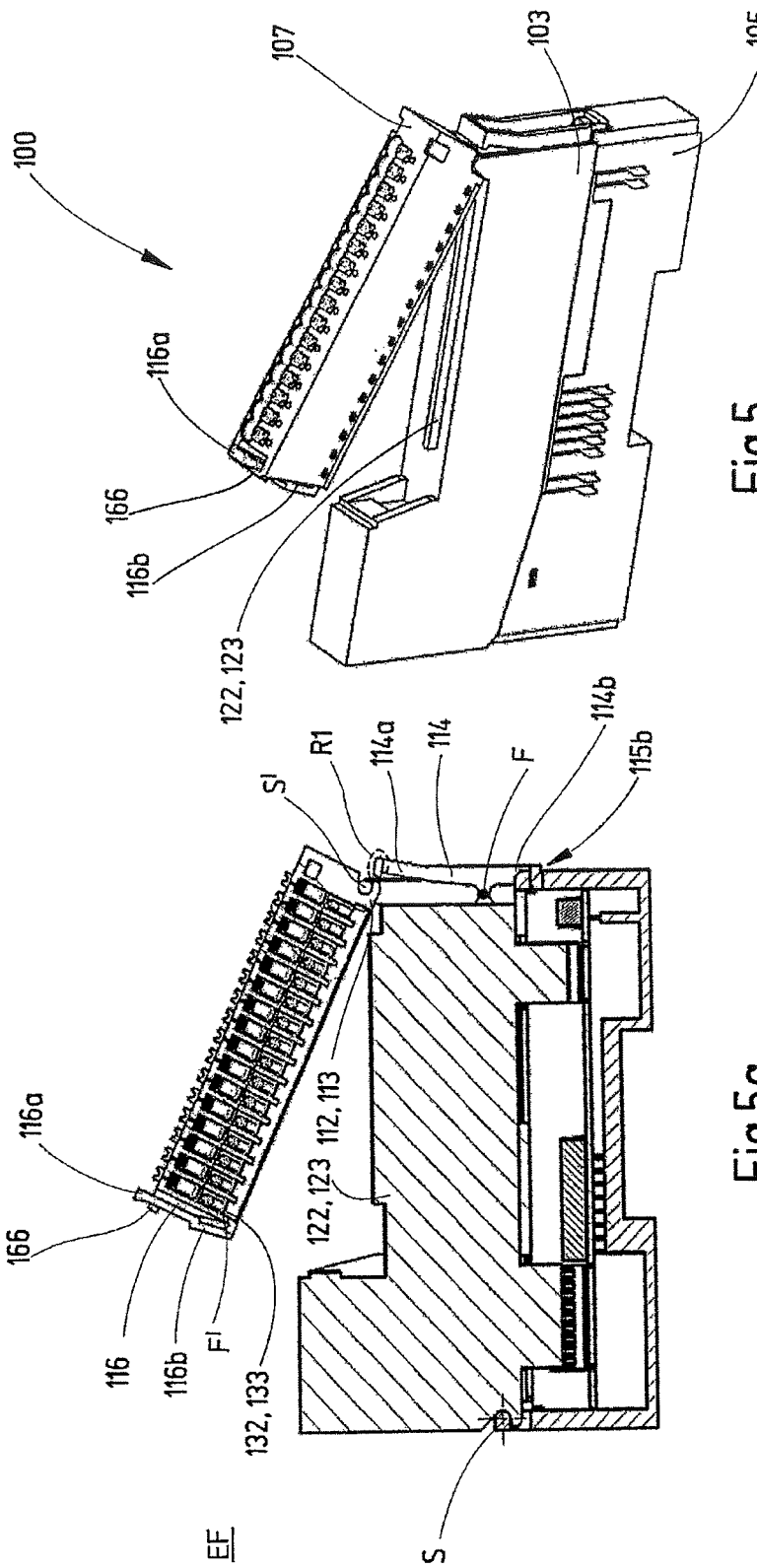

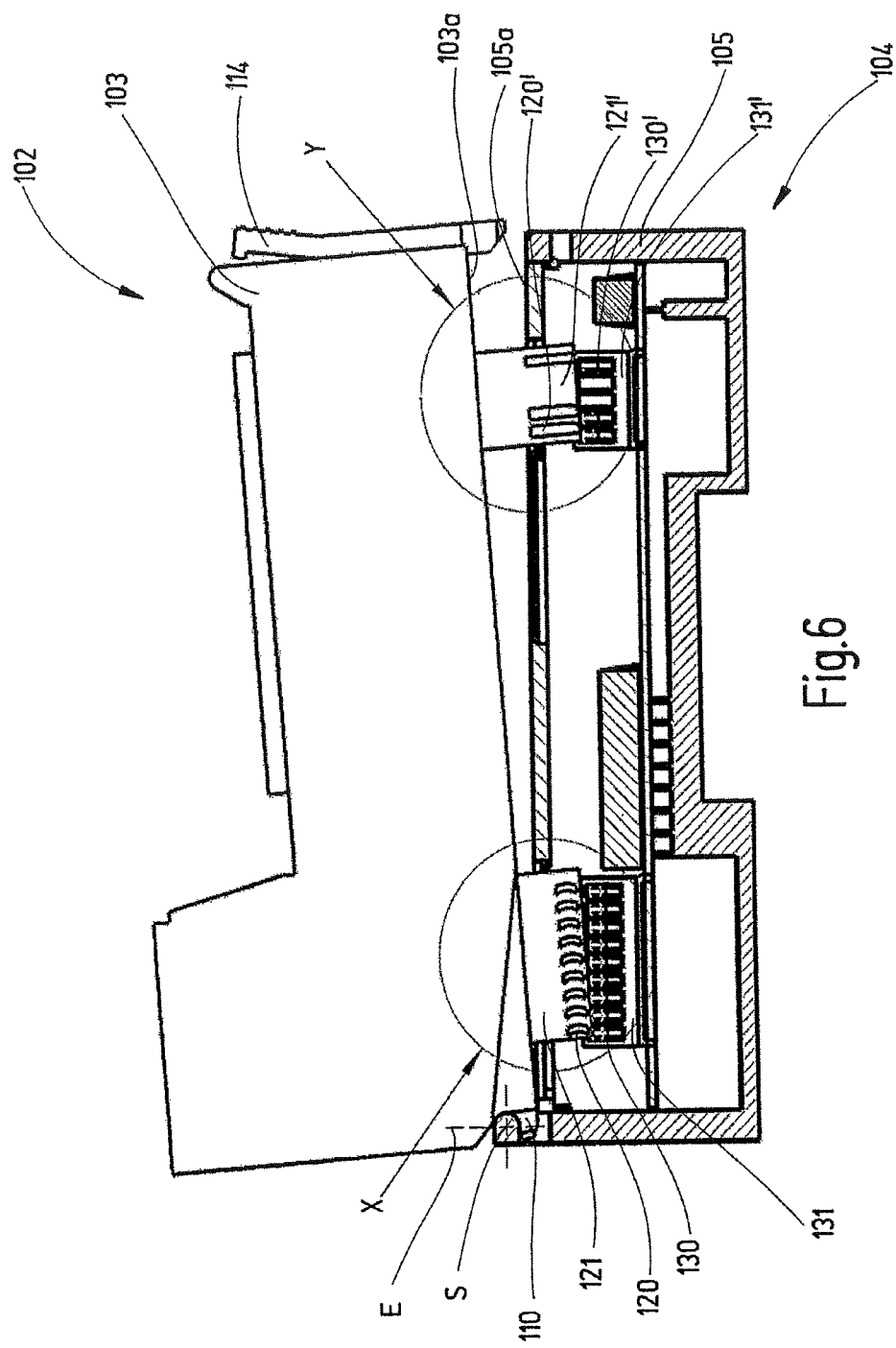

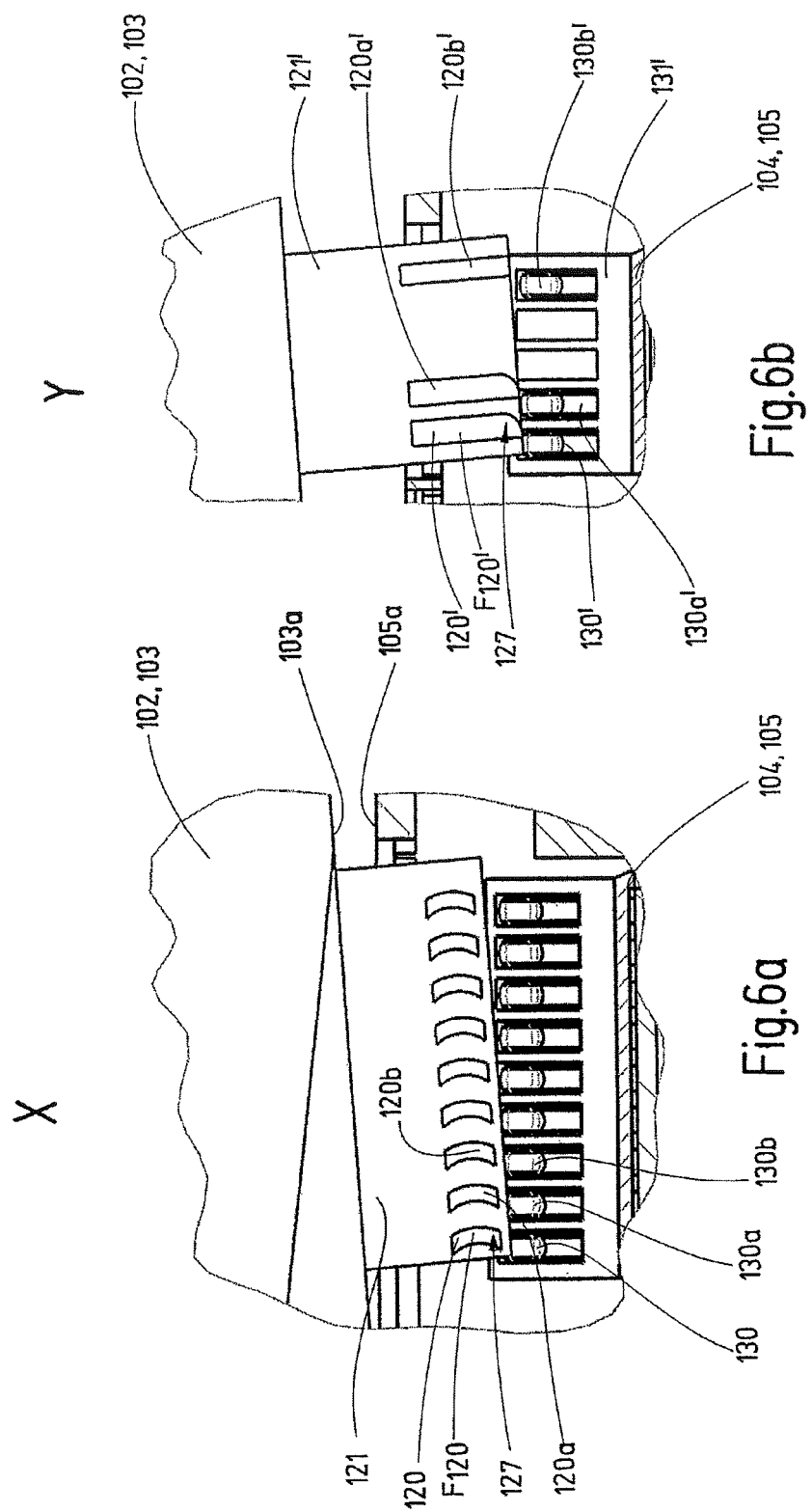

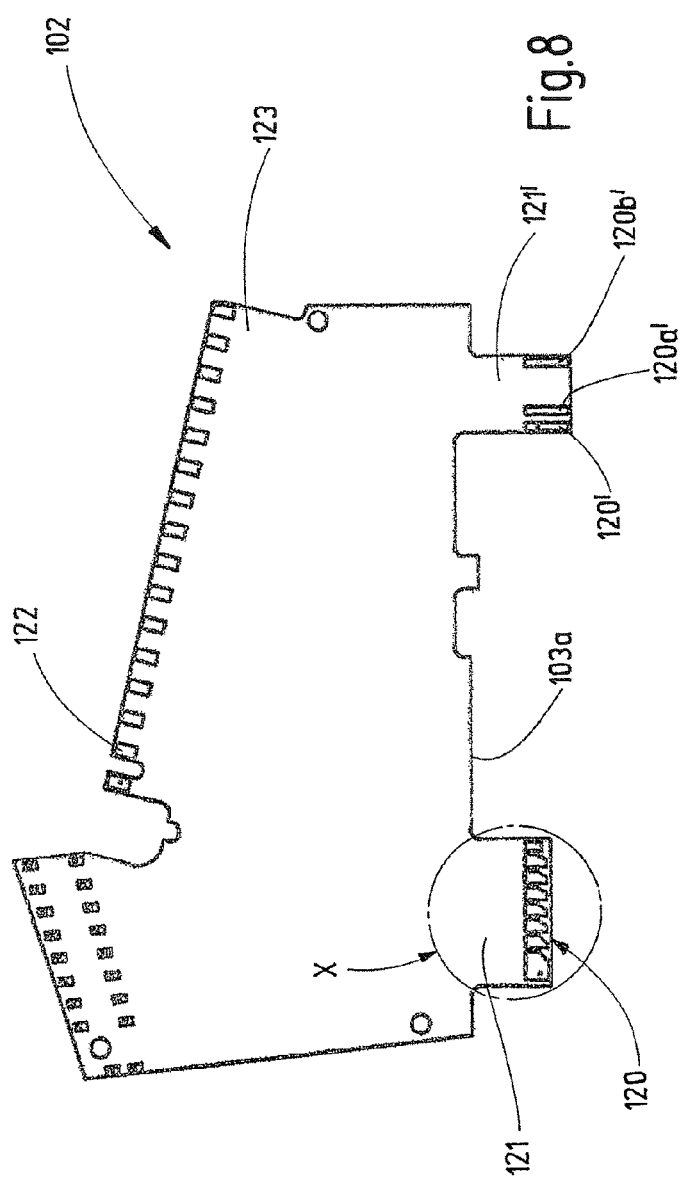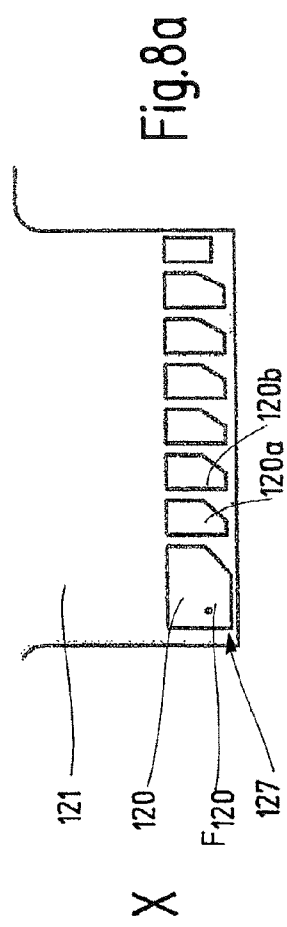

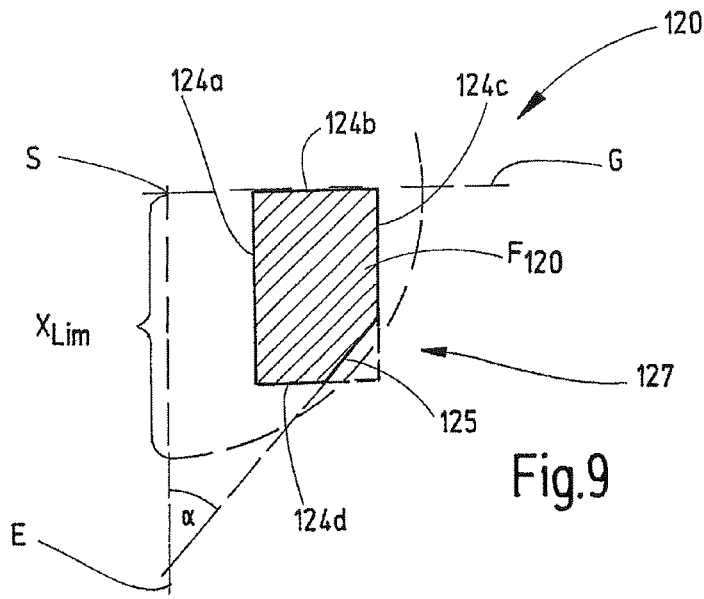
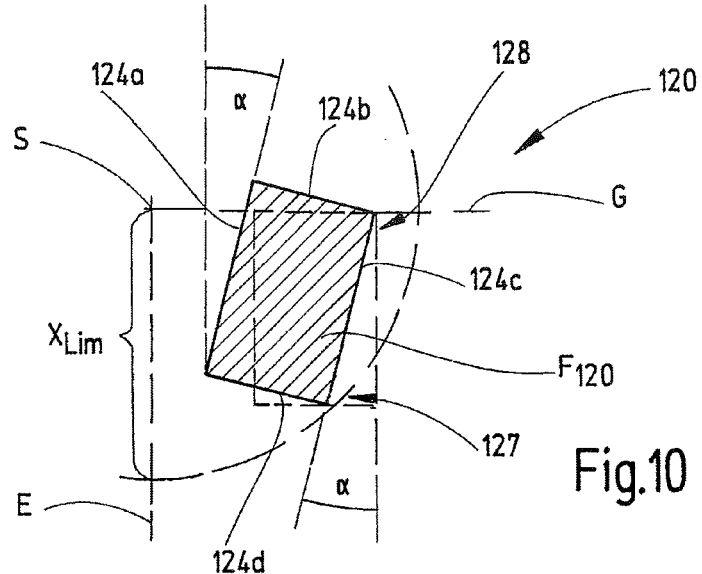
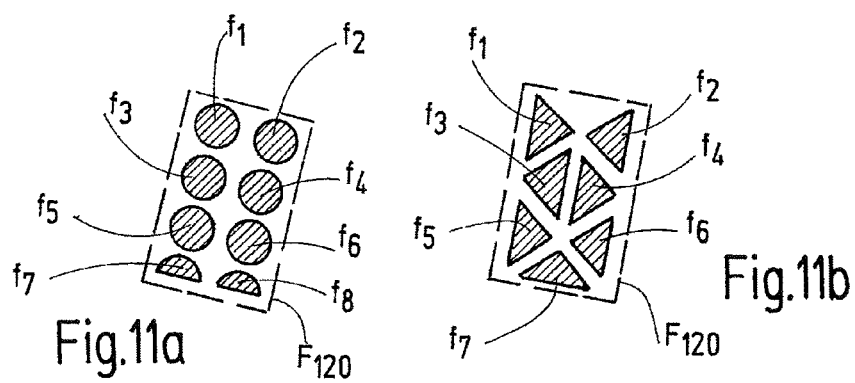

MODULAR CONTROL APPARATUS

CROSS-REFERENCES TO RELATED APPLICATIONS

This application is a continuation of international patent application PCT/EP2012/064683 filed on Jul. 26, 2012 designating the U.S., which international patent application has been published in German language and claims priority from German patent application DE 10 2011 110 184.9 filed on Aug. 9, 2011. The entire contents of these priority applications are incorporated herein by reference.

BACKGROUND OF THE INVENTION

The present invention relates to a modular control apparatus for the automated control of a technical installation.

A control apparatus in terms of the present invention can be, for example, a modular control apparatus for a configurable or programmable controller. It may be a configurable controller such as, for example, that which is marketed by the applicant of the present invention under the trade name PNOZ® or a programmable controller such as, for example, that which is marketed by the applicant under the trade name PSS®, or controllers similar to these. In this case, configurable is understood to mean matching or adjusting of a hardware component of the controller, such as, for example, wiring. In this case, programmable is understood to mean matching or adjusting a software component of the controller, for example by means of a programming language.

In particular, applicant's PSSuniversal provides a modular programmable control apparatus for standard and safety tasks, as is known from the system description "Pilz, PSSuniversal, Programmable Control Systems PSS®, System Description, No. 21256 EN 04". In this case, a module comprises a first module part in the form of an electronics module part and a second module part in the form of a basic module part, also referred to as bus module part in the following. The electronics module part is plugged onto the bus module part by virtue of a linear movement.

A control apparatus in terms of the present invention can, however, also be a control apparatus comprising a module with three module parts. One such control apparatus is known, for example, from the X20 system by B&R, as is clear from the system description "X20 System, User's Manual, Version: 2.10 (May 2009), Model number: MAX20 ENG". In this case, a module comprises a first module part in the form of an electronics module part, a second module part in the form of a bus module part and a third module part in the form of a field terminal module part, also referred to as connection module part. The external connectors in this system are accommodated in a separate connection module part. The connection module part can be positioned on the electronics module part by a pivoting movement.

DE 297 13 960 U1 discloses an electrical or electronic device for positioning on a mounting rail, comprising a housing, comprising at least one printed circuit board arranged in the housing and comprising bus contacts oriented in longitudinal direction of the mounting rail for a data and/or energy bus connection to adjacent electrical or electronic devices positioned on the mounting rail and having corresponding bus contacts. The housing is formed in at least two parts. It has an upper part accommodating the printed circuit board and a base part having the bus contacts and comprising a printed circuit board receptacle. The upper part can be pivoted onto the base part.

A problem with such control apparatuses comprising pivotable module parts may be that, in the case of a relatively small design, contact-making errors can occur when the module parts are combined by a pivoting movement.

SUMMARY OF THE INVENTION

Against this background, it is an object of the present invention to provide a control apparatus of the type mentioned at the outset which avoids contact-making errors or faulty contacts, and therefore avoids potential short circuits, in the case of increasing miniaturization or a relatively small design.

In accordance with one aspect of the invention, there is provided a control apparatus for the automated control of a technical installation, comprising at least one module having at least a first module part and a second module part, which can be mechanically and electrically combined to form a combined arrangement, wherein the first module part and the second module part each comprise a housing, each housing having a boundary surface, wherein the boundary surfaces are opposite one another in the combined arrangement such that a boundary plane is defined, wherein the first module part has a pivoting holder element on which the second module part is detachably held, the pivoting holder element defining a pivot point with a pivot axis such that the first module part and the second module part can be combined by a pivoting movement along a defined movement path around the pivot axis to the form the combined arrangement, wherein the pivot axis defines a pivot axis plane perpendicular to the boundary plane and parallel to the pivot axis, wherein one of the module parts has a number of contacts comprising a first electrical contact, and wherein the other module part has a number of corresponding mating contacts comprising a first mating contact, wherein, in the first combined arrangement, each electrical contact makes contact with its corresponding mating contact for electrical connection between the first and the second module parts, wherein the contacts and the mating contacts are arranged in a contact plane extending perpendicular to the pivot axis, wherein the contacts each are conductor tracks on a nonconductive board such that a printed circuit board is formed, wherein the first electrical contact has an exposed contact area defined by a first outer contour and comprising a leading end with respect to the movement path, and wherein the first outer contour, in the combined arrangement, comprises at least one section which is inclined towards the pivot axis plane at least at the leading end.

In accordance with another aspect, there is provided a module part for use in a control apparatus for the automated control of a technical installation, the control apparatus comprising at least one module having a first module part and a second module part, which are mechanically and electrically combined to form a combined arrangement, the module part being configured to be used as the first module part and comprising a housing having a boundary surface and defining a boundary plane, a pivoting holder element on which the second module part can be detachably held, the pivoting holder element defining a pivot point with a pivot axis such that the first module part and the second module part can be combined by a pivoting movement along a defined movement path around the pivot axis to form the combined arrangement, the pivot axis defining a pivot axis plane perpendicular to the boundary plane and parallel to the pivot axis, and a number of conductor tracks arranged on a printed circuit board and forming contacts comprising a first electrical contact for making contact with a first mating contact of said second module part, wherein the first electrical contact has an exposed contact area defined by a first outer contour and comprising a leading end with respect to the movement path, and wherein the first outer contour comprises at least one section which is inclined towards the pivot axis plane at the leading end.

One module part comprises a number of electrical contacts, and the other module part comprises a number of corresponding electrical mating contacts. In the combined arrangement, each contact makes contact with its corresponding mating contact for the electrical connection between the module parts. It is thus possible to make complex types of contact. For example, a plurality of connections or inputs and/or outputs can thus be provided. Each of the number of contacts has an exposed contact area which is defined by an outer contour and comprises a leading end running ahead in the direction of the movement path. Some or each of the contacts have an outer contour which comprises the inclined section. The contacts or mating contacts can in particular be arranged next to one another in a row.

An undesired contact is produced in particular when a first contact in the course of the pivoting movement makes contact with a second mating contact, which is assigned to a second contact next to the first contact (in the radial direction, starting from the pivot point) (and is not assigned to the first contact). The contacts and/or the mating contacts are in this case arranged next to one another, in particular in a contact plane which runs perpendicular to the pivot axis. It has been found that such undesired contact-making is dependent on the radial distance between the respective (first) contact and the pivot point and dependent on the relative distance between the contacts. Owing to the fact that the leading end of the contact area of the respective (first) contact comprises at least one section which is inclined towards the pivot axis plane (plane which is arranged perpendicular to the boundary plane and is defined by the pivot axis), the situation is avoided in which the contact area, in the course of the pivoting movement, makes contact with the (second) mating contact, which is assigned to the (second) contact next to the respective (first) contact. The outer contour of the exposed contact area is matched to the pivoting movement. An exposed contact area should in particular be understood to mean the outwardly exposed or electrically conductive area with which contact can be made. In the case of a small design, in particular a small distance between the contacts or contact areas and/or a small radial distance from the pivot point, contact-making errors or undesired contacts, and therefore possibly short circuits, can therefore be prevented. Very precise contact-making is now possible.

Overall, the novel control apparatus and the novel module or module part therefore make it possible to avoid contact-making errors or faulty contacts, and therefore possibly short circuits, in the case of a small design. The abovementioned object is therefore completely achieved.

In a refinement, the inclined section is located at least in the region of the leading end of the first outer contour which has the greatest radial distance from the pivot point.

In this refinement, it is not necessary for the entire outer contour of the contact area to be matched, but only a critical region. In particular, only the critical region of the outer contour can have the inclined section. The critical region is the region of the leading end of the first outer contour which has the greatest radial distance from the pivot point.

In a further refinement, the inclined section comprises at least one straight line or a curvature.

In this refinement, a particularly suitable and/or simple embodiment of the inclined section is provided.

In a further refinement, the first outer contour is a four-sided or five-sided outer contour.

In this refinement, said outer contour can be assumed to be a conventional rectangular outer contour which is matched in such a way that it comprises the inclined section. The implementation of the inclined section is therefore simple.

In a further refinement, the inclined section is a straight side, comprising the straight line, of the four-sided or five-sided outer contour. In one variant of this refinement, the inclined section or the first outer contour comprises two (inclined) sides running parallel to one another.

In this refinement, in the case of a four-sided (for example conventional rectangular) outer contour, the outer contour or contact area can simply be arranged at an angle. In the case of a five-sided outer contour, starting from a four-sided (for example conventional rectangular) outer contour, a corner can simply be beveled. In particular, the straight inclined side can have a specific angle in relation to the pivot axis plane.

In a further refinement, the inclined section is a curved side, comprising the curvature, of the four-sided or five-sided outer contour. In one variant of this refinement, the first outer contour comprises two curved sides running parallel to one another.

In this refinement, optimum matching with respect to the likewise curved movement path of the pivoting movement is possible.

In a further refinement, the first contact area has a number of contact areas which are insulated from one another.

In this refinement, the desired outer contour can be provided by a number of relatively small contact areas. The outer contour can therefore be matched in a very variable manner.

In a further refinement, the module part with the first mating contact further comprises a second electrical mating contact, which is next to the first mating contact in the outward radial direction and has an exposed contact area which is defined by a second outer contour. Each point on the first and second outer contours has a certain radial distance from the pivot point during the pivoting movement. Each point on the first outer contour has a radial distance which is smaller than a radial distance of a point on the second outer contour which has the smallest radial distance of the points on the second outer contour.

This refinement prevents the first contact from making contact with a second mating contact, which is next to the first mating contact, during the course of the pivoting movement. The second mating contact is assigned to a second contact which is next to the first contact in the outward radial direction (starting from the pivot point) and is not assigned to the first contact.

In a further refinement, the inclined sections of the outer contours of the contacts differ as the radial distance between the contact and the pivot point increases.

In this refinement, even more accurate contact-making is provided by even more accurate matching to the pivoting movement. The precise position of each contact in relation to the pivot point is taken into consideration. The differences are matched to the pivoting movement. In particular, inclined sections vary in such a way that the inclined sections or the outer contours are matched to the pivoting movement. In particular, the outer contour, or the angle of a straight, inclined side, can be adapted in relation to the pivot axis plane as the radial distance between the contact and the pivot point increases.

In a further refinement, the first module part and the second module part are designed in such a way that a last contact of the number of contacts closes at last with the corresponding mating contact in the pivoting movement. The last contact is in particular the contact with the greatest radial distance from the pivot point.

In this refinement, a specific closing sequence of the contacts can be defined. This means that this closing sequence is always maintained by the defined movement path of the pivoting movement about the pivot axis. In particular, the exposed contact areas can all have the same distance from the boundary surface of the module part.

In a further refinement, the control apparatus or the module has an output for outputting a signal, which indicates the operational readiness of the control apparatus or the module when, during assembly, the last contact closes.

In this refinement, safe identification of the combined (or operationally ready) state of the module is achieved by taking into consideration the specific closing sequence of the contacts.

In a further refinement, the second module part comprises a cutout, into which the pivoting holder element of the first module part can engage, with the result that the second module part is detachably held. The pivoting holder element can be in particular a projection (for example curved projection or the like), which engages in the cutout.

This refinement ensures that a fixedly defined (clean) pivoting movement about a fixedly defined pivot point takes place. The risk of undesired contact-making is therefore even further reduced.

In a further refinement, at least one module comprises at least the first module part, the second module part and a third module part. The first module part and the second module part can be mechanically and electrically combined to form a first combined arrangement. The first module part and the third module part can be combined mechanically and electrically to form a second combined arrangement.

In a further refinement, the first module part comprises a signal processing unit. Alternatively or in addition, the second module part comprises at least one bus connection for a communications bus or supply voltage bus. As a further alternative or in addition, the third module part comprises at least one external connector for supplying a signal or a voltage.

In this refinement, an optimum distribution of different functions between the three module parts can be provided. In particular, the function of an electronics module part can thus be assigned to the first module part, the function of a bus module part can be assigned to the second module part, and the function of a connection module part can be assigned to the third module part.

In a further refinement, the first module part has two redundant signal processing channels in order to process at least one input signal in a manner redundant with respect to one another. The two redundant signal processing channels can each be capable of performing logic signal combinations in order to generate a signal depending on this. This signal can preferably be used to drive a switching element for shutdown of the technical installation. The at least one input signal can be a signal which is present at the external connector of the third module part. Preferably, the two signal processing channels process two input signals with redundancy with respect to one another. Each of the two input signals can then be a signal which is present at in each case one external connector of the third module part.

In this refinement, the corresponding module or module part implements safety tasks or safety functions. In particular, in this case the corresponding module or module part can be used for failsafe (FS) shutdown of the technical installation.

In a further refinement, the first mating contact is a contact element which is arranged in a male connector or a female connector. Alternatively or in addition, the mating contacts are contact elements which are arranged next to one another in a male connector or a female connector. In particular, the printed circuit board can be inserted into the male connector or the female connector. Thus, a plug-type connection is formed. In particular, in the first combined arrangement, the printed circuit board is inserted into the male connector or the female connector. Thus, each contact can make contact with its corresponding mating contact for the electrical connection between the first and second module parts.

In a further refinement, the mating contacts extend in their longitudinal direction parallel to the pivot axis plane. The mating contacts or the outer contours of their exposed contact areas therefore do not have an inclined section. Therefore, a conventional male connector or female connector can still be used for the mating contacts.

It goes without saying that the features mentioned above and yet to be explained below can be used not only in the respectively cited combination, but also in other combinations or on their own without departing from the scope of the present invention.

BRIEF DESCRIPTION OF THE DRAWINGS

Exemplary embodiments of the invention are illustrated in the drawing and will be explained in more detail in the description below. In the drawing:

FIG. 3 shows a perspective illustration of the exemplary embodiment of the control apparatus shown in FIG. 2 with only second module parts, FIG. 4 shows a perspective illustration of a first exemplary embodiment of a module with a first, second and third module part in a first and second combined arrangement, FIG. 4a shows a cross sectional view of the module shown in FIG. 4, FIG. 5 shows a perspective illustration of the first exemplary embodiment of the module shown in FIG. 4 in a state in which the third module part is detached, FIG. 5a shows a cross sectional view of the module shown in FIG. 5, FIG. 6 shows a cross-sectional view of the first exemplary embodiment of the module shown in FIGS. 4 to 5 in a state in which the first module part is detached, FIG. 6a shows a first enlarged region X of the cross-sectional view shown in FIG. 6, FIG. 6b shows a second enlarged region Y of the cross-sectional view shown in FIG. 6, FIGS. 7a-c each show a contact area, whose outer contour comprises an inclined section with at least one curvature, FIG. 8 shows a cross-sectional view of a first module part of a variant of the first exemplary embodiment of the module, FIG. 8a shows an enlarged region X of the cross sectional view shown in FIG. 8a, FIGS. 9 and 10 each show a contact area, whose outer contour comprises an inclined section with at least one straight line, FIGS. 11a-b each show a contact area with a number of contact areas which are insulated from one another.

DESCRIPTION OF PREFERRED EMBODIMENTS

Figure 1:
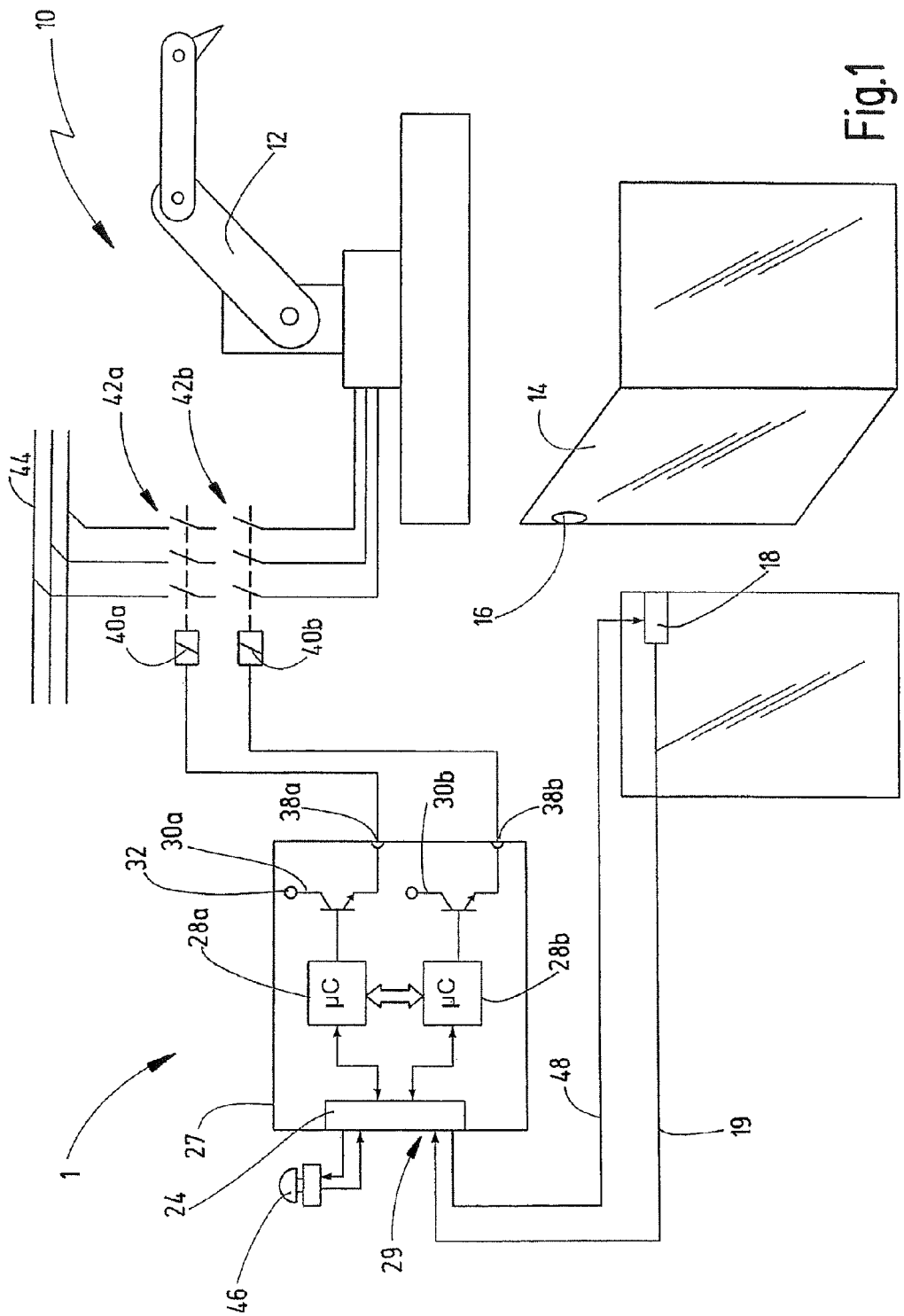
FIG. 1 shows a simplified illustration of a technical installation with an exemplary embodiment of the control apparatus.

FIG. 1 illustrates a technical installation 10 with an exemplary embodiment of the novel control apparatus 1 for the automated control of the technical installation 10. In this exemplary embodiment, the control apparatus 1 is configured for the failsafe shutdown of the installation 10, i.e. the control apparatus 1 is used for safety tasks. The installation 10 in this case comprises, by way of example, a robot 12, whose movements during working operation pose a risk to people in the working area of the robot 12. For this reason, the working area of the robot 12 is safeguarded by a safety fence with a safety door 14. The safety door 14 enables access into the working area of the robot 12, for example for maintenance work or for setup work. During normal working operation, however, the robot 12 should only be able to operate when the safety door 14 is closed. As soon as the safety door 14 is opened, the robot 12 needs to be shut down or brought into a safe state in another way.

In order to detect the closed state of the safety door 14, a safety door switch with a door part 16 and a frame part 18 is fitted to the safety door 14. The frame part 18 generates a safety door signal on a line 20, which signal is supplied to the novel control apparatus 1 via line 20.

In this exemplary embodiment, the control apparatus 1 has an I/O part 24 with a plurality of connectors (external or device connectors) 29. In some exemplary embodiments, the connectors 29 are connection terminals or field terminals which are arranged on one housing side of the housing 27 of the control apparatus 1, for example on a connection module part, as will be explained below. For example, these may be spring loaded terminals or screw terminals. In other exemplary embodiments, the connectors can be male connectors or female connectors which comprise a plurality of contact elements (pins), wherein one pin forms one respective connection. Often, female M8 connectors with five contact pins are used for the connection of signaling devices or other sensors on field level. Correspondingly, exemplary embodiments of the novel control apparatus can be or can comprise field devices which are arranged outside a switchgear cabinet in the physical vicinity of the robot 12.

In this exemplary embodiment, the control apparatus 1 has two redundant signal processing channels. By way of example, in this case two microcontrollers 28a, 28b are illustrated, which are each connected to the I/O part 24. The microcontrollers 28a, 28b in this case process, with redundancy with respect to one another, the input signals which are picked up by the control apparatus 1 at the device connections of the I/O part 24, and said microcontrollers compare the results of this, which is illustrated by an arrow 29. Instead of two microcontrollers 28a, 28b, microprocessors, ASICs, FPGAs and/or other signal processing circuits can be used. Preferably, exemplary embodiments of the control apparatus 1 have at least two signal processing channels which have redundancy with respect to one another and which are each capable of performing logic signal combinations in order to generate a signal depending thereon. This signal is then used to drive a switching element for shutting down the technical installation 10 or the robot 12. Such a control apparatus 1 can then be used for the failsafe (FS) shutdown of the installation 10, in this case the robot 12.

In the case illustrated here, the control apparatus 1 has two redundant switching elements 30a, 30b. Each of these two switching elements is capable of connecting a high voltage potential 32 to a device connector 38a, 38b of the control apparatus 1 in order to enable a current flow to a contactor 40a, 40b or to interrupt this current flow. Thus, each of the switching elements 30 can shut down an actuator, such as a contactor or a solenoid valve.

The contactors 40a, 40b each have working contacts 42a, 42b. The working contacts 42a, 42b are in this case arranged in series with one another in a power supply path from a power supply 44 to the robot 12. As soon as the control apparatus 1 shuts down the contactors 40a, 40b, the contacts 42 drop out and the power supply for the robot 12 is shut down. It is clear to those skilled in the relevant art that such a "radical" shutdown is described here by way of example. As a deviation from this, in the case of a safety requirement only parts of the robot 12 can be shut down, such as the hazardous drives, while other parts of the robot 12 remain functional. A delayed shutdown is also conceivable in order that the robot 12 can be braked in a controlled manner, possibly prior to the shutdown of the drives.

The control apparatus 1 controls the switching elements 30a, 30b in this case depending on the signal of the safety door switch on the line 19 and depending on a further input signal from an emergency stop button 46. The emergency stop button 46 is also connected to device connectors of the control apparatus 1 via lines. Preferably, each of the input signals can be present in redundant fashion or in each case two input and output lines or connections can be provided (not illustrated in FIG. 1). In the example shown in FIG. 1, therefore, two input lines or inputs can be provided for the emergency stop button 46, which input lines or inputs each provide an input signal from the emergency stop button 46. The same applies to the signal of the safety door switch.

In some exemplary embodiments, the control apparatus 1 generates output signals which are supplied to the individual signaling devices. By way of example, such an output signal is passed via a line 48 to the frame part 18 of the safety door switch. The frame part 18 loops the output signal of the safety switching device 1 from the line 48 onto the line 19 when the door part 16 is located in the vicinity of the frame part 18, i.e. when the safety door 14 is closed. Therefore, the control apparatus 1 can monitor the safety door switch with the aid of the output signal on the line 48 and with the aid of the input signal on the line 19. In a comparable manner, the control apparatus 1 in this case monitors the emergency stop button 46.

As a deviation from the illustration in FIG. 1, in practice two redundant output signals of the control apparatus 1 are often used which are each passed via a separate signal line to a signaling device and are looped back to the control apparatus 1 via this signaling device. Reference is made by way of example for such an embodiment to DE 10 2004 020 995 A1, which is incorporated by reference in respect of the details relating to such a redundant monitoring of a signaling device. The emergency stop button 46 is also often in practice monitored using redundant input and output lines, as mentioned above.

In the exemplary embodiment illustrated in FIG. 1 of the control apparatus 1, the control apparatus is used for safety tasks, in particular for the failsafe (FS) shutdown of an installation. However, the control apparatus 1 can also be used for non-safety related tasks or standard tasks (ST).

The control apparatus 1 can be in particular a programmable control apparatus for programmable control of the technical installation. Alternatively, the control apparatus 1 can also be a configurable control apparatus. Configurable is in this case understood to mean matching or adjusting of a hardware component of the controller, such as wiring, for example. Programmable is in this case understood to mean matching or adjusting of a software component of the controller, for example by means of a programming language.

The control apparatus 1 can comprise at least one bus, in particular a communications bus and/or supply voltage bus. For example, the control apparatus 1 can be a decentralized control apparatus, whose components are connected to one another via a bus. The control apparatus can comprise in particular a head module for coordination of the data traffic on the (communications) bus. In the case of a control apparatus 1 for safety tasks, the (communications) bus can be, for example, a failsafe bus such as SafetyBUS p or PROFINET. In the case of a control apparatus 1 for standard tasks, the bus can be, for example, a standard field bus such as CANOpen or DeviceNet or the like.

Figure 2:
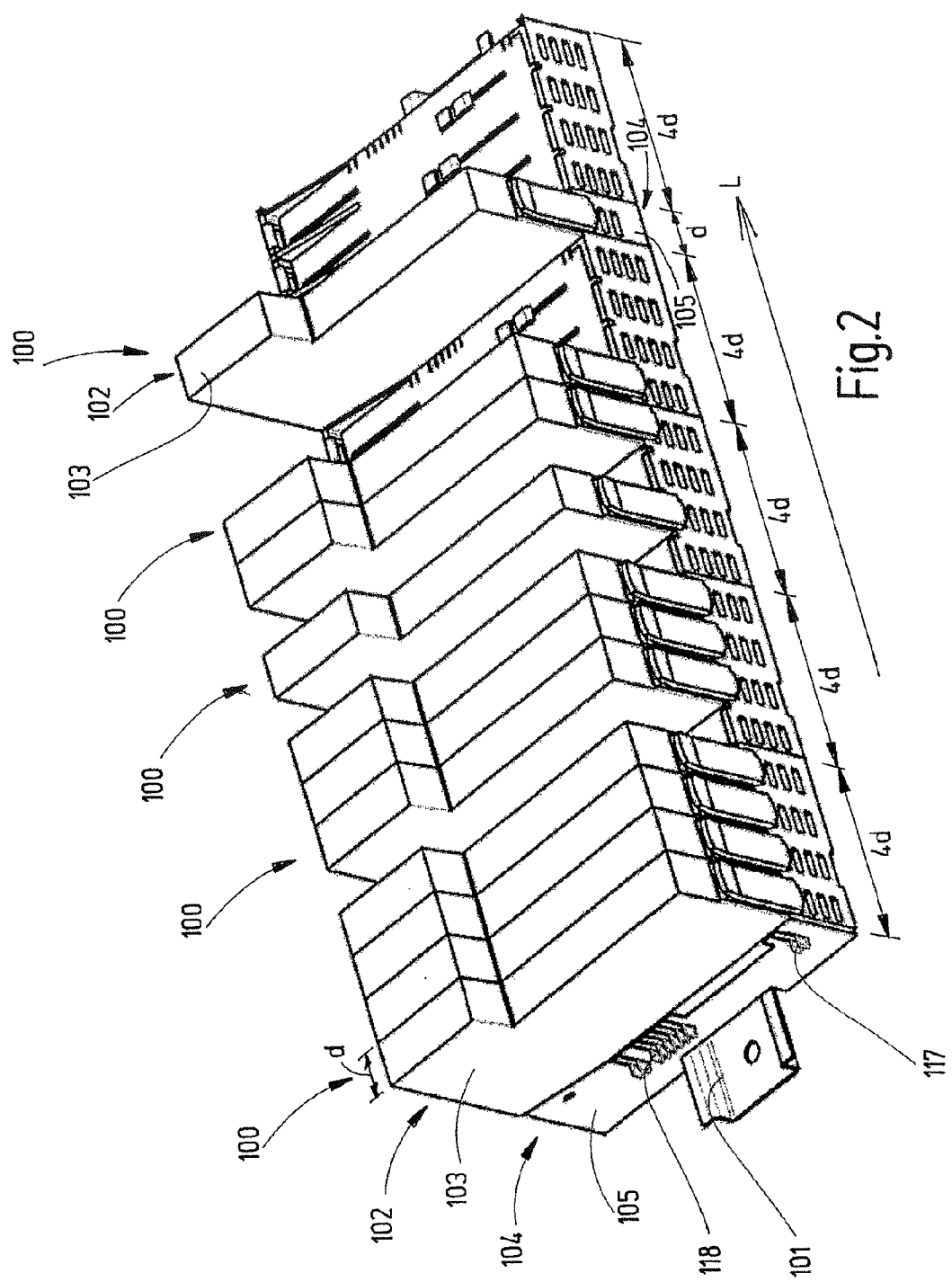
FIG. 2 shows a perspective illustration of an exemplary embodiment of the control apparatus with a plurality of modules arranged next to one another with first module parts and second module parts.

The control apparatus 1 is in particular a modular control apparatus comprising at least one module. FIG. 2 shows a perspective illustration of an exemplary embodiment of the modular control apparatus comprising a plurality of modules 100 arranged next to one another with first module parts 102 and second module parts 104. Third module parts 106 are not illustrated in FIG. 2. The first module part 102 comprises a housing 103. The second module part 104 comprises a housing 105. The second module part 104 comprises at least one bus connector 117, 118. The second module part 104 is therefore also referred to as bus module part in the following.

FIG. 3 shows a perspective illustration of the exemplary embodiment of the control apparatus shown in FIG. 2 with only the second module parts (bus module parts) 104. The second module parts (bus module parts) 104 and the modules 100, respectively, are arranged next to one another in a longitudinal direction L. The second module parts 104 and the modules 100, respectively, are fitted on a guide rail 101, as shown in FIG. 3. The second module part (bus module part) 104 has a bus connector 117 for a supply voltage bus and a bus connector 118 for a communications bus. The second module part (bus module part) 104 comprises a first electrical bus connector 117, 118 on a first side of the housing 105 for electrical connection to a neighboring module part which is adjacent in the longitudinal direction L (in FIGS. 2 and 3 a neighboring module part which is adjacent on the right hand side). The second module part (bus module part) 104 further comprises a second electrical bus connector 117', 118' (not shown in FIG. 3) on a second side, which is opposite the first side, of the housing 105 for electrical connection to another neighboring module part which is adjacent in the longitudinal direction L (a neighboring module part which is adjacent on the left hand side in FIG. 2 and FIG. 3). In particular, the second electrical bus connector 117', 118' can be connected to the corresponding first electrical bus connector 117, 118 of the other neighboring module part. In this way, the supply voltage bus and the communications bus are connected beyond the second module parts (bus module parts) 104.

The control apparatus 1 can further comprise a head module (not illustrated in FIG. 2 and FIG. 3), which comprises interfaces and a processing part, in particular for coordination of the data traffic on the (communications) bus, as described above. The head module can then likewise be fitted on the guide rail 101. The head module can be arranged next to the second module parts (bus module parts) 104 or modules 100, in the longitudinal direction L, as described above. In FIG. 2 and FIG. 3, the head module can be arranged on the left hand side next to the first module 100 in the longitudinal direction L, for example, and connected to the modules via the first bus connector 117, 118. Each module 100 or the corresponding first module part (electronics module part 102), can be an I/O (input/output) module or module part. The I/O module or module part can be a failsafe (FS) module or a non-failsafe standard module (ST). By way of example, reference is made in respect of such an embodiment to WO 2005/003869 A1, which is incorporated by reference in respect of details relating to such a modular control apparatus.

As can be seen from FIG. 3, a so called backplane is formed by the mutually adjacent second module parts (bus module parts) 104. Then, first module parts 102 can be arranged in freely selectable fashion on this backplane. The backplane in this case forms in particular a substantially planar topside. A continuous arrangement of first module parts (electronics module parts) 102 next to one another in a row on the backplane is not necessary. As can be seen in FIG. 2, it is not necessary for a first module part (electronics module part) 102 to be arranged on a specific second module part (bus module part) 104 or a specific section of a basic width d of a second bus module part (bus module part) 104.

Again with reference to FIG. 2, at least one first module part 102 can be plugged onto a respective second module part 104 (bus module part). Preferably, the first module part 102 comprises an electrical control circuit for the automated control, for example using one or more processing units, as explained with reference to FIG. 1. The first module part 102 is also referred to below as electronics module part. The first module part 102 (electronics module part) and the second module part 104 (bus module part) can be mechanically and electrically combined to form a first combined arrangement, as shown in FIG. 2. By virtue of this modular design of the control apparatus 1, it is possible to respond to changes and adaptations without considerable complexity.

In the exemplary embodiment illustrated in FIG. 2 and FIG. 3, the second module part (bus module part) 104 is provided with a plurality of width forms. The first module part (electronics module part) 102 has a basic width d in the longitudinal direction L. Some of the second module parts 104 (bus module part) each have a width in the longitudinal direction L which is an integer multiple (n times) the basic width d, in particular in this case a width which is four times the basic width d (denoted by 4d in FIG. 2 and FIG. 3). In this case, the integer multiple is therefore an even numbered multiple, namely 4. Four times the basic width has proven to be particularly suitable for the assembly of a relatively large backplane. However, any other suitable integer multiple may be selected.

As can be seen from the exemplary embodiment in FIG. 2 and FIG. 3, another second module part (bus module part) 104 has a width which corresponds to the basic width d. The second module part (bus module part) is therefore provided in two width forms with different widths, namely in a first width form with the basic width d and in a second width form with a width 4d, which is four times the basic width d. The backplane can thus be combined in freely selectable fashion by arranging second module parts (bus module parts) of the first and/or second width form next to one another. By providing second module parts (bus module parts) 104 with a width which is an integer multiple of the basic width d, fewer second module parts 104 are required in comparison with the use of exclusively second module parts 104 with the basic width d.

In the exemplary embodiment illustrated in FIG. 2, all of the first module parts (electronics module parts) 102 have the basic width d in the longitudinal direction L. However, it is also possible for other first module parts 102 to be provided which have a width in the longitudinal direction L which is an integer multiple of the basic width d (m times), in particular an even numbered multiple (for example double). For example, other first module parts can have a width in the longitudinal direction which is double the basic width d. The first module part (electronics module part) is thus provided in two width forms with two different widths, namely in a first width form with the basic width d and in a second width form with a width which is an integer multiple (m times) the basic width d. The first module part in the second width form can then be arranged beyond a disconnection point between two second module parts (bus module parts) 104 adjacent to one another.

FIG. 4 shows a perspective illustration of a first exemplary embodiment of a module 100, which comprises a first module part 102, a second module part 104, and a third module part 106. FIG. 4a shows a corresponding cross sectional view of the module 100 shown in FIG. 4. The first or second module part 102, 104 in this exemplary embodiment can be in particular a first or second module part as explained with reference to FIG. 2 and FIG. 3. The third module part 106 comprises a housing 107. The third module part 106 further comprises at least one external connector 129 for applying a signal or a voltage from the outside. The connectors 129 can in particular be or comprise the connectors 29 described with reference to FIG. 1. In FIG. 4 and FIG. 4a, a plurality of external connectors 129 are illustrated which are arranged adjacent to one another on the housing 107 of the third module part. The third module part 106 is therefore also referred to as connection module part in the following. In the exemplary embodiment illustrated, the third module part 106 comprises sixteen external connectors 129, which are arranged in a single row (16 pole and single row). However, it should be understood that any other suitable number and arrangement of external connectors can be provided. An external connector may be an output for transmitting an output signal (for example to an actuator) or an input for picking up an input signal (for example from a sensor).

As already explained with reference to FIG. 2, the first module part 102 and the second module part 104 can be mechanically and electrically combined to form a first combined arrangement. The first module part 102 and the third module part 106 can also be mechanically and electrically combined to form a second combined arrangement. FIG. 4 and FIG. 4a show the module parts in the first and second combined arrangements.

The mechanical assembly of the module parts will now be described in more detail below with reference to FIG. 4a. As can be seen from FIG. 4a, the third module part (connection module part) 106 has a pivoting holder element 112, on which the first module part (electronics module part) 104 can be or is detachably held. The pivoting holder element 112 thus defines a pivot point S' with a pivot axis A'. In this way, the first module part 102 and the third module part 106 can be mechanically combined by a pivoting movement along a defined movement path into the second combined arrangement. As can be seen from FIG. 4a, the first module part (electronics modular part) 102 also comprises a pivoting holder element 110, on which the second module part 104 (bus module part) can be or is detachably held. The pivoting holder element 110 thus defines a pivot point S with a pivot axis A. In this way, the first module part 102 and the second module part 104 are combined by a pivoting movement along a defined movement path into the second combined arrangement. In the exemplary embodiment illustrated in FIG. 4a, the pivoting holder element 110, 112 in each case comprises a projection (for example curved projection, hook or the like), which engages in a cutout in the corresponding other module part. A pivotable connection is thus provided. The module parts can thus be combined safely and reliably by a simple pivoting movement about a fixedly defined pivot point. In the exemplary embodiment illustrated, the pivoting holder element 110 of the first module part 102 and the pivoting holder element 112 of the third module part are arranged on mutually opposite sides of the module 100. Thus, the third module part 106 can be pivoted away in a first direction (towards the right in FIG. 4a), and the first module part 102 can be pivoted away in a second direction opposite the first direction (towards the left in FIG. 4a).

The electrical assembly of the module parts will now be described in more detail below with reference to FIG. 4a. The first module part (electronics module part) 102 comprises at least one electrical contact 120 and the second module part (bus module part) 104 comprises at least one first electrical mating contact 130, which, in the first combined arrangement, makes contact with the first electrical contact 120 for the electrical connection between the first module part (electronics module part) 102 and the second module part (bus module part) 104. The first electrical contact 120 of the first module part 102 is a conductor track on a nonconductive board, with the result that a printed circuit board 121 is formed. The first mating contact 130 of the second module part 104 is a contact element (pin) which is arranged in a male or female connector 131. The printed circuit board 121 can be inserted into the male or female connector 131. Thus, a plug type connection is formed. In particular, a plurality of electrical contacts 120 and a plurality of corresponding mating contacts 130 are provided. The plurality of contacts 120 are arranged next to one another on the printed circuit board 121. The plurality of corresponding mating contacts 130 are arranged correspondingly next to one another in the male or female connector 131.

As can be seen from FIG. 4 and FIG. 4a, the contacts 120 and the corresponding mating contacts 130 each form a first group. In this exemplary embodiment, the first group serves the purpose of transmitting the voltage or the signal of the communications bus which is connected by means of the bus connectors 117 from the second module part (bus module part) 104 to the first module part (electronics module part) 102. Furthermore, a second group of contacts 120' is provided on a corresponding printed circuit board 121', and corresponding mating contacts 130' are provided in a male or female connector 131', as already described with reference to the contacts 120 and mating contacts 130. In this exemplary embodiment, the second group of contacts 120' or mating contacts 130' serves the purpose of transmitting the voltage of the supply voltage bus, which is connected by means of the bus connectors 118, from the second module part (bus module part) 104 to the first module part (electronics module part) 102.

FIG. 5 shows a perspective illustration of the first exemplary embodiment of the module 100 shown in FIG. 4 in a state in which the third module part (connection module part) 106 is detached. FIG. 5a shows a corresponding cross sectional view of the module 100 shown in FIG. 5. As can be seen from FIG. 5 and FIG. 5a, the third module part (connection module part) 106 also comprises at least one first electrical contact 132, and the first module part (electronics module part) 102 comprises at least one corresponding first electrical mating contact 122, which, in the second combined arrangement, makes contact with the first electrical contact 132 of the third module part (bus module part) 106 for the electrical connection between the first module part (electronics module part) 102 and the third module part (connection module part) 106. The first electrical mating contact 122 of the first module part 102 is a conductor track on a nonconductive board, with the result that a printed circuit board 123 is formed. The first electrical contact 132 of the third module part 106 is a contact element (pin) which is arranged in a male or female connector 133. The printed circuit board 123 can be inserted into the male or female connector 133. Thus, a plug type connection is formed. In particular, a plurality of first electrical contacts 132 of the third module part 106 and a plurality of corresponding first electrical mating contacts 122 of the first module part 102 are provided. The plurality of first electrical contacts 132 of the third module part 106 are arranged next to one another in the male or female connector 133. The plurality of corresponding first electrical mating contacts 122 of the first module part 102 are arranged correspondingly next to one another on the printed circuit board 123.

In order to secure the first and second module parts 102, 104 in the first combined arrangement against one another, the first module part 102 (electronics module part) comprises a securing element 114 with a securing engagement section 114b. The securing element 114 or the securing engagement section 114b is movable into a first and a second position. In the first position, as illustrated in FIG. 4 and FIG. 4a, the securing engagement section 114b is in securing engagement with the second module part 104 (bus module part) in the first combined arrangement, with the result that the first module part (electronics module part) 102 and the second module part (bus module part) 104 are secured against one another. The securing engagement section 114b shown in FIG. 4a is a projection or bar which, in the first position, is in securing engagement with a cutout 115b of the second module part 104. It should be understood that this mechanical engagement can be achieved or described in any suitable manner. For example, a projection or bar of the second module part 104 can also engage in a cutout in the first module part 102 or the securing element 114.

In the second position (not illustrated in FIG. 4 and FIG. 5) of the securing element 114, the securing engagement section 114b is arranged in the first combined arrangement in such a way that the first module part (electronics module part) 102 and the second module part (bus module part) 104 are detachable from one another. In the second position of the securing element 114, the first module part (electronics module part) 102 and the second module part (bus module part) 104 are therefore not secured against one another. The securing element 114 furthermore comprises a securing actuation section 114a, by means of which the securing element 114 is movable in the first combined arrangement between the first and second positions when a force is exerted on the securing actuation section 114a.

As can be seen from FIGS. 4, 4a, 5 and 5a, the third module part 106 (connection module part) also comprises a securing element 116 with a securing engagement section 116b in order to secure the first and third module parts 102, 106 in the second combined arrangement against one another. The securing element 116 or the securing engagement section 116b is movable into a first and a second position. In the first position, as illustrated in FIG. 4a, the securing engagement section 116b is in securing engagement with the first module part 102 (electronics module part) in the second combined arrangement, with the result that the first module part (electronics module part) 102 and the third module part (connection module part) 106 are secured against one another. The securing engagement section 116b shown in FIG. 4a is a projection or bar which, in the first position, is in securing engagement with a cutout in the first module part 102. It should be understood that this mechanical engagement can be achieved or described in any suitable manner. For example, a projection or bar of the first module part 102 can also engage in a cutout in the third module part 106 or the securing element 116.

FIG. 6 shows a cross-sectional view of the first exemplary embodiment of the module shown in FIGS. 4 to 5 in a state in which the first module part is detached. The mechanical assembly or detachment of the first module part (electronics module part) 102 and the second module part (bus module part) 104 will be described in more detail below. The housing 103 of the first module part (electronics module part) 102 in this case comprises a boundary surface 103a and the housing 105 of the second module part (bus module part) 104 comprises a boundary surface 105a (shown in FIG. 6), which are opposite one another in the first combined arrangement or state (as can be seen, for example, in FIGS. 4 to 5) in such a way that a boundary plane G is defined. In FIGS. 4a and 5a, the boundary plane G runs horizontally into the plane of the drawing. A pivot axis plane E (as can be seen in FIG. 6) is defined by the pivot axis A, which is defined by the pivoting holder element 110 of the first module part 102 (as described above). In FIG. 6, the pivot axis plane E runs vertically into the plane of the drawing. The boundary plane G and the pivot axis plane E are orthogonal to one another. The boundary surfaces 105a of the second module parts (bus module parts) 104 form the backplane. The printed circuit boards 121, 121' of the first module part 102 can be inserted into corresponding cutouts (with mating contacts 130, 130' or male or female connectors 131, 131') in the housing 105 and through the boundary surface 105a of the second module part. The first module part (electronics module part) 102 and second module part (bus module part) 104 therefore lie in planar fashion one on top of the other in the boundary plane G in the first combined arrangement or state.

FIG. 6a shows a first enlarged region X of the cross-sectional view shown in FIG. 6 and FIG. 6b shows a second enlarged region Y of the cross-sectional view shown in FIG. 6. FIG. 6a shows the contacts 120, which form the first group, as described above, and the corresponding mating contacts 130. FIG. 6b shows the contacts 120', which form the second group, as described above, and the corresponding mating contacts 130'. In the first combined arrangement, each contact 120, 120a, 120b and 120', 120a', 120b' makes contact with its corresponding mating contact 130, 130a, 130b, and 130', 130a', 130b', respectively, for the electrical connection between the first module part 102 and the second module part 104. The contacts 120, 120a, 120b and 120', 120a', 120b' and the mating contacts 130, 130a, 130b and 130', 130a', 130b', respectively, are arranged next to one another in a contact plane K, which runs perpendicular to the pivot axis A. In FIGS. 6, 6a and 6b, the contact plane K runs in or parallel to the plane of the drawing.

In FIG. 6a and FIG. 6b, by way of example in each case a first electrical contact 120 or 120', a second contact 120a or 120a' which is next to the first contact in the radially outward direction, and a third contact 120b or 120b', which is next to the second contact in the radially outward direction, are provided with reference numerals. In addition, the corresponding mating contacts 130, 130a, 130b or 130', 130a', 130b' are provided with reference numerals. As can be seen in FIG. 6a, the first group of contacts also comprises further contacts. It should be noted that any desired number of contacts can be provided.

The contacts 120, 120a, 120b and 120', 120a', 120b' each are provided on a corresponding printed circuit board 121 and 121', respectively. The contacts each are conductor tracks on a nonconductive board, with the result that a printed circuit board 121 or 121' is formed. The conductor track can be provided in particular by means of printing and/or etching. The mating contacts 130, 130a, 130b and 130', 130a', 130b' are each a contact element (pin), which is arranged in a male connector or female connector 131. The mating contacts 130, 130a, 130b and 130', 130a', 130b' are contact elements (pins), which are arranged next to one another in the male connector or female connector 131. The printed circuit board 121, 121' can be inserted into the male connector or the female connector 131, 131'. In the first combined arrangement, the printed circuit board 121, 121' is inserted into the male connector or the female connector 131, 131'. Thus, any contact 120, 120a, 120b or 120', 120a', 120b' can make contact with its corresponding mating contact 130, 130a, 130b or 130', 130a', 130b' for the electrical connection between the module parts 102, 104.

The first electrical contact 120 has an exposed contact area $F_{120}$ which is defined by a first outer contour and comprises a leading end 127 with respect to the movement path of the pivoting movement. In particular, each of the number of contacts 120, 120a, 120b and 120', 120a', 120b' has an exposed contact area $F_{120}$ which is defined by an outer contour and comprises a leading end with respect to the movement path, as shown in FIGS. 6, 6a and 6b. An exposed contact area should in particular be understood to mean the electrically conductive area which is exposed towards the outside or is contactable. An electrically insulating material can be found outside the exposed contact area $F_{120}$. The conductor track of a contact runs from the exposed face into the housing of the first module part 102. As can be seen in FIGS. 6, 6a and 6b, an electrically insulating material is located over a region of a respective conductor track which does not form the exposed contact area F120. The course of the conductor track from the exposed contact area $F_{120}$ into the housing 103 of the first module part 102 is therefore not shown in FIGS. 6, 6a and 6b.

The outer contour comprises (in the combined arrangement or state), at least at the leading end 127, a section which is inclined towards the pivot axis plane E. In FIG. 6a, each of the contacts 120, 120a, 120b comprises a section inclined towards the pivot axis plane E. In FIG. 6b, only some of the contacts, in this case contacts 120' and 120a', comprise a section inclined towards the pivot axis plane. In FIG. 6b, the third contact 120b' has a contact area with a conventional rectangular outer contour.

The inclined section in FIGS. 6, 6a and 6b comprises a curvature. The inclined section is located at least in the region of the leading end 127 of the first outer contour which has the greatest radial distance from the pivot point S (lower right-hand corner of the outer contour in the figures). Therefore, in particular the critical region of the outer contour is modified or inclined. The critical region is the region of the leading end 127 of the outer contour which (in relation to the entire leading end) has the greatest radial distance from the pivot point S. The mating contacts 130, 130a, 130b and 130', 130a', 130b' or the outer contours of their exposed contact areas, on the other hand, do not have an inclined section. The mating contacts 130, 130a, 130b and 130', 130a', 130b' run in their longitudinal direction parallel to the pivot axis plane E. In the case of a four-sided or rectangular outer contour, the outer contour of the exposed contact area of a mating contact runs exclusively perpendicular and/or parallel to the pivot axis plane E. It does not have an inclined section. Therefore, a conventional male connector or female connector 131 can still be used.

Figure 7A:
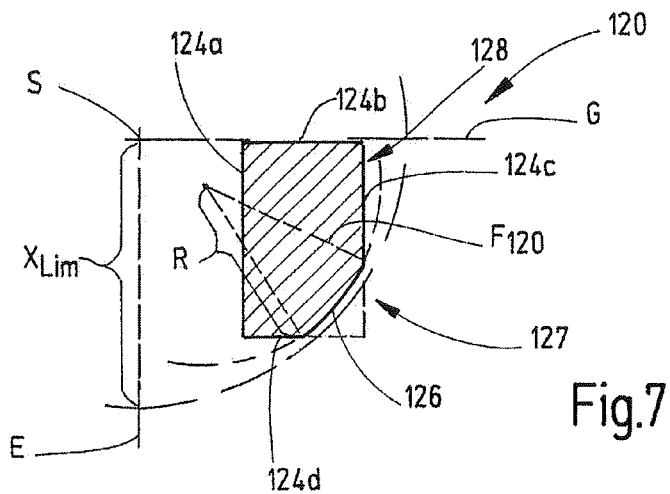
Figure 7B:
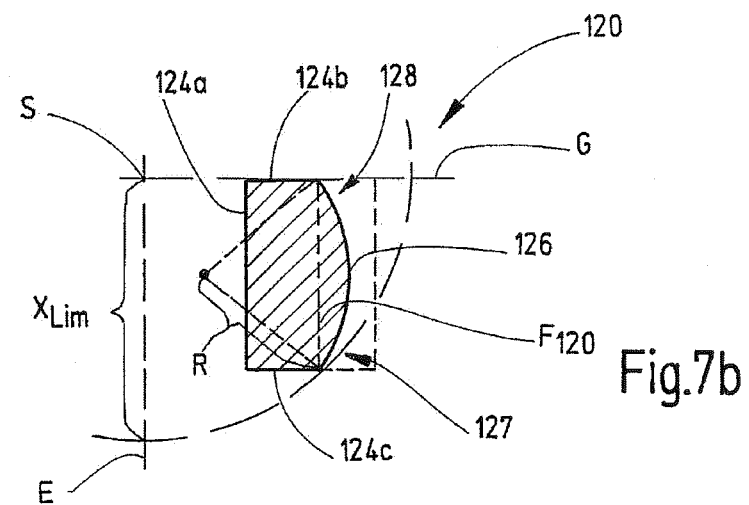
Figure 7C:
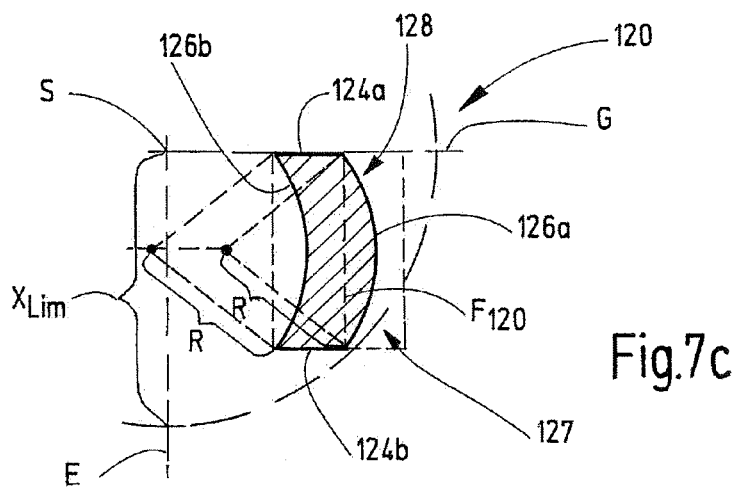

FIGS. 7a, 7b and 7c each show a contact area $F_{120}$ (illustrated with hatching), whose outer contour comprises an inclined section with at least one curvature. The outer contour has a leading end 127 with respect to the movement path and a trailing end 128 with respect to the movement path. In FIGS. 7a-c, the inclined section with the curvature is located in the region or the corner of the leading end 127 which has the greatest radial distance x from the pivot point S. Each point on the outer contour has a certain radial distance x from the fixedly defined pivot point S during the pivoting movement. As can be seen in FIGS. 7a-c, each point on the first outer contour has a radial distance x which is smaller than a radial distance $x_{lim}$ (limit distance or critical distance).

In FIG. 7a, the outer contour is a five-sided outer contour with four straight sides 124a, 124b, 124c, 124d and a curved side 126 with the curvature (with radius R). In FIG. 7a, the inclined section with the curvature or the curved side 126 is arranged in a corner of an otherwise conventionally rectangular outer contour (indicated by dashed lines). Starting from a conventionally rectangular outer contour, therefore, in this case one corner is beveled. The contact area $F_{120}$ shown in FIG. 7a substantially corresponds to the contact area of the first or second contact 120', 120a' shown in FIG. 6b.

In FIG. 7b, the outer contour is a four-sided outer contour with three straight sides 124a, 124b, 124c and one curved side 126 with the curvature (with radius R). In FIG. 7b, the inclined section with the curvature or the curved side 126 is arranged on a side of an otherwise conventionally rectangular outer contour (indicated by dashed lines).

In FIG. 7c, the outer contour is a four-sided outer contour with two straight sides 124a, 124b and two curved sides 126a, 126b, which each comprise the curvature (with radius R). The two curved sides 126a, 126b are two curved sides which run parallel to one another. The two straight sides 124a, 124b are also two straight sides running parallel to one another. The contact area $F_{120}$ shown in FIG. 7c substantially corresponds to the contact area of one of the contacts 120, 120a, 120b shown in FIG. 6a.

FIG. 8 shows a cross-sectional view of a first module part 102 of a variant of the first exemplary embodiment of the module. FIG. 8a shows an enlarged region X of the cross-sectional view shown in FIG. 8. The statements and explanations given in respect of the first exemplary embodiment likewise relate to this variant of the exemplary embodiment. However, the inclined section in this variant comprises a straight line, in contrast to the inclined section with a curvature shown in FIGS. 6, 6a and 6b.

FIG. 9 and FIG. 10 each show a contact area $F_{120}$ (illustrated with hatching), whose outer contour comprises an inclined section with at least one straight line. In FIG. 9, the outer contour is a five-sided outer contour with four straight sides 124a, 124b, 124c, 124d and a straight inclined side 125. In FIG. 9, the inclined section therefore precisely has a straight line. The contact area shown in FIG. 9 substantially corresponds to the contact area $F_{120}$ shown in FIGS. 8 and 8a. In FIG. 9, the inclined section with the straight line or the straight inclined side 125 is arranged in a corner of an otherwise conventionally rectangular outer contour (indicated by dashed lines). Starting from a conventionally rectangular outer contour, therefore, in this case a corner is beveled. The inclined side has a certain angle α with respect to the pivot axis plane E. The angle α is greater than 0° and less than 90°, in particular between 30° and 60°, in particular approximately 45°.

In FIG. 10, the inclined section is a four-sided outer contour with four straight sides 124a, 124b, 124c, 124d. The outer contour is a conventional rectangular outer contour, but is arranged at an angle. The sides 124a and 124c each comprise the inclined section and each form a straight inclined side. The two straight inclined sides 124a, 124c run parallel to one another. The straight inclined sides 124a, 124c each have a certain angle α in relation to the pivot axis plane E.

Specific exemplary embodiments of the outer contour of the contact area have been described with reference to FIGS. 4 to 10. However, it should be understood that any other suitable outer contour of the contact area can be used as long as this comprises a section which is inclined towards the pivot axis plane as described above.

FIG. 11a and FIG. 11b each show a contact area $F_{120}$ with a number of contact areas f which are insulated from one another. In FIG. 11a, the contact areas f1 to f8 which are insulated from one another each are round or half-round contact areas. In FIG. 11b, the contact areas f1-f7 which are insulated from one another are each triangular contact areas. The desired outer contour can thus be provided by a number of relatively small contact areas. The outer contour can therefore be matched in a very variable manner. It should be understood that any other outer contour of the contact areas f which are insulated from one another can be used.

Figure 12:
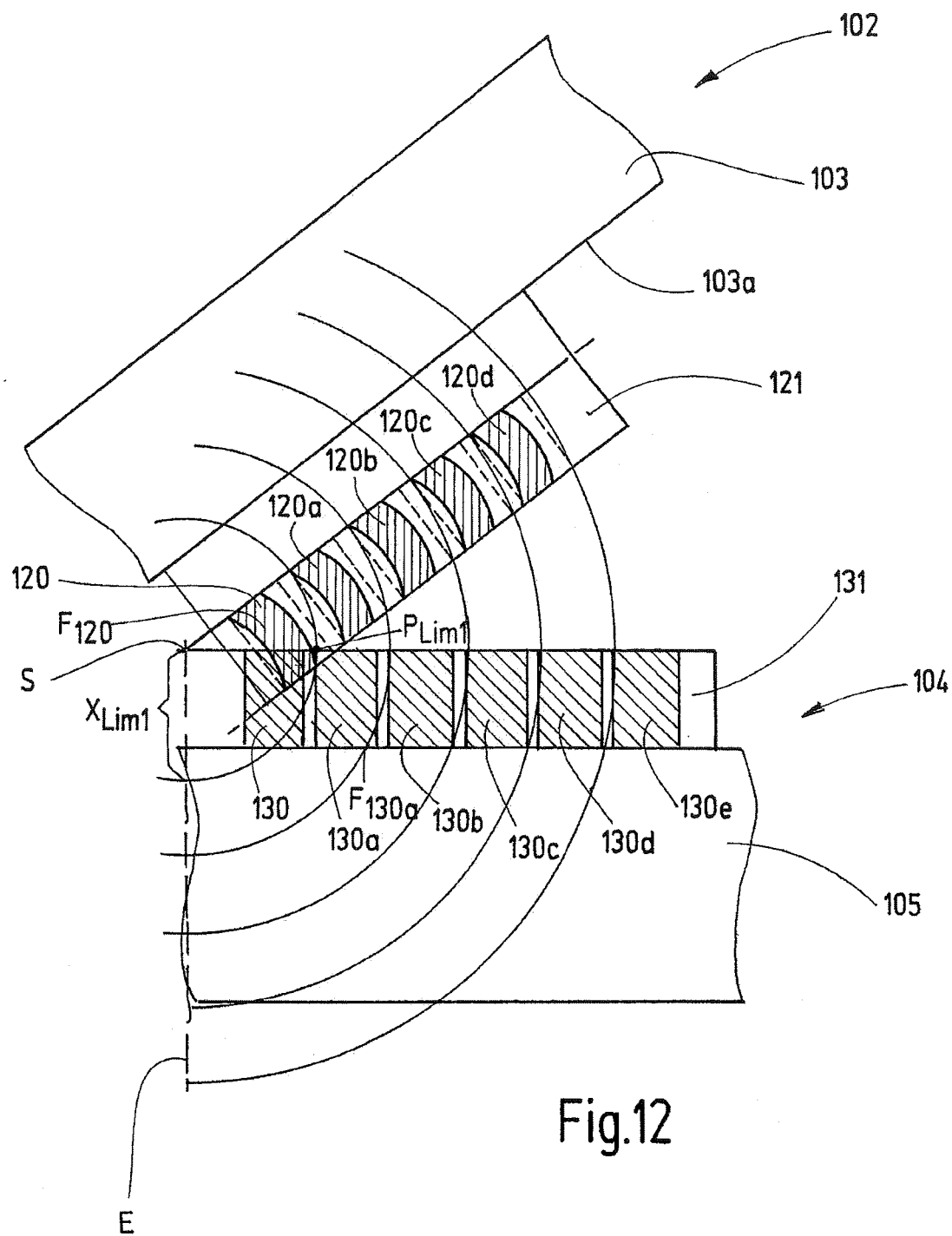
FIG. 12 shows a cross-sectional view of a detail of a first module part and a second module part in accordance with an exemplary embodiment in a state in which the first module part is positioned by a pivoting movement.

FIG. 12 shows a first cross-sectional view of a detail of a first module part 102 and a second module part 104 in accordance with an exemplary embodiment in a state in which the first module part 102 is positioned by a pivoting movement. The statements and explanations given with respect to the first exemplary embodiment likewise apply to this exemplary embodiment. The contacts 120, 120a, 120b, 120c, 120d shown in FIG. 12 each comprise a contact area with an outer contour having two curved sides which run parallel to one another, as already described with reference to FIG. 6a. The first module part 102 comprises the first electrical contact 120 and the second module part 104 comprises the corresponding electrical mating contact 130. The second module part 104 furthermore comprises a second electrical mating contact 130a which is next to the first mating contact 130 in the outward radial direction. The second electrical mating contact 130a has an exposed contact area $F_{130a}$ which is defined by a second outer contour. Each point on the first outer contour of the first contact 120 has a certain radial distance x from the pivot point S during the pivoting movement. Each point on the second outer contour of the second mating contact 130a has a certain radial distance x from the pivot point S during the pivoting movement. Each point on the first outer contour of the first contact 120 has a radial distance x which is smaller than a radial distance $x_{lim1}$ (limit distance or critical distance) of a point $P_{lim1}$ of the second outer contour which has the smallest radial distance (from pivot point S) of the points on the second outer contour.

Figure 13:
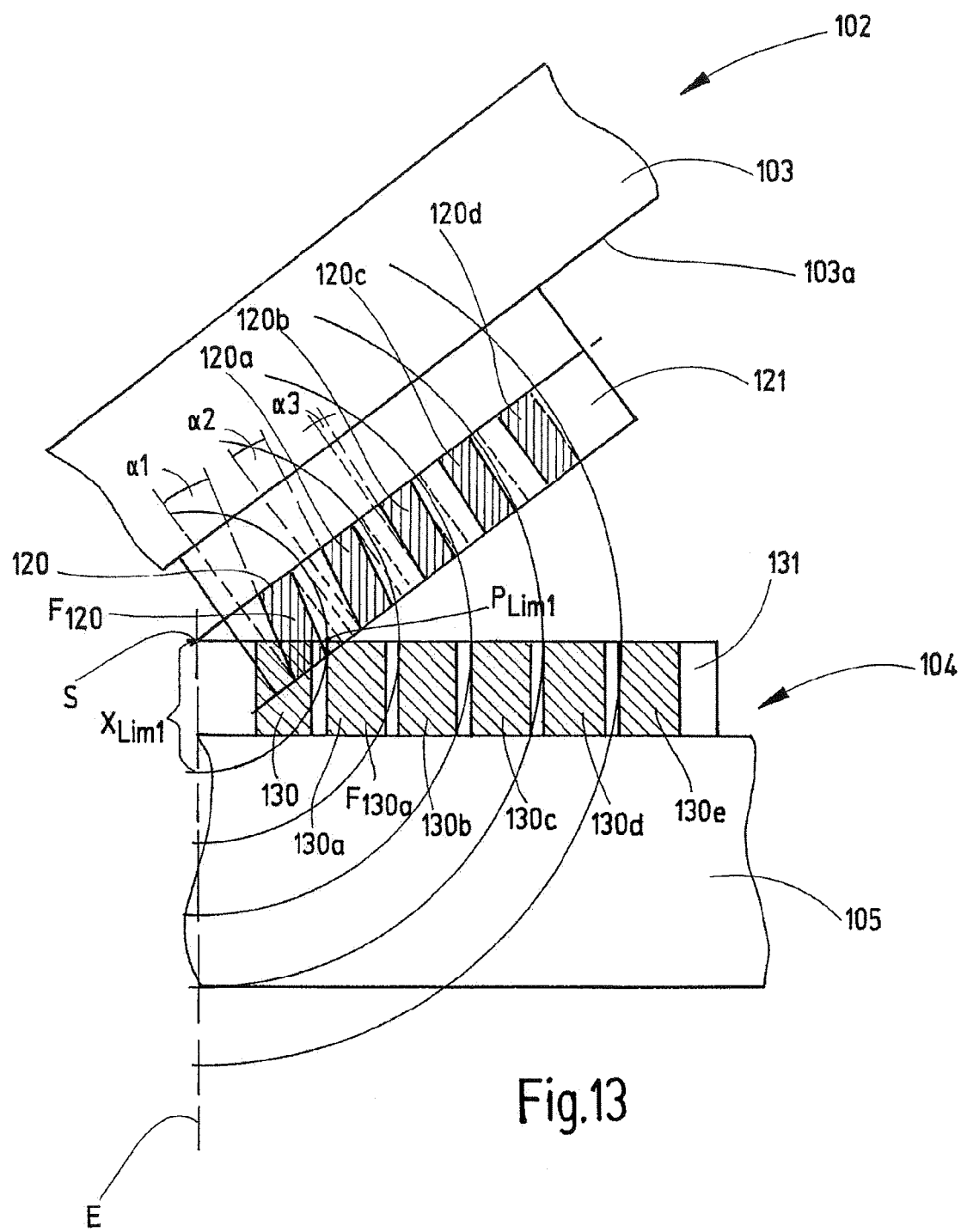
FIG. 13 shows a cross-sectional view of a detail of a first module part and a second module part in accordance with another exemplary embodiment in a state in which the first module part is positioned by a pivoting movement.

FIG. 13 shows a cross-sectional view of a detail of a first module part 102 and a second module part 104 in accordance with another exemplary embodiment in a state in which the first module part 102 is positioned by means of a pivoting movement. The statements and explanations given with respect to the first exemplary embodiment likewise apply to this exemplary embodiment. However, in the exemplary embodiment shown in FIG. 13, the inclined sections of the outer contours of the contacts 120, 120a, 120b, 120c, 120d vary as the radial distance x between the contact 120, 120a, 120b, 120c, 120d and the pivot point S increases. This variation is matched to the pivoting movement. To be more precise, the inclined sections vary such that the inclined sections or the outer contours are matched to the pivoting movement. In the exemplary embodiment shown in FIG. 13, the angle α1, α2, α3 of the straight inclined sides changes with respect to the pivot axis plane E as the radial distance x between the contact 120, 120a, 120b, 120c, 120d and the pivot point S increases. The angle α1, α2, α3 in this case decreases as the radial distance increases. In another exemplary embodiment, however, the outer contour can also vary. For example, the radius of the curvatures or curved sides shown in FIG. 12 can vary (in particular decrease) as the radial distance x between the contact 120, 120a, 120b, 120c, 120d and the pivot point S increases. Even more precise matching to the pivoting movement is thus provided since the precise position of each contact in relation to the pivot point is taken into consideration.

In the above-described exemplary embodiments, only the outer contours of the contact or the contacts 120 have an inclined section. The outer contours of the mating contact or the mating contacts 130, on the other hand, do not have an inclined section. The mating contacts 130 run in their longitudinal direction parallel to the pivot axis plane E. Therefore, a conventional male connector or female connector 131 can still be used.

In the above-described exemplary embodiments, the first module part 102 and the second module part 104 each are designed in such a way that a last contact 120d of the number of contacts 120, 120a, 120b, 120c, 120d closes at last with the corresponding mating contact during the pivoting movement. The exposed contact areas in this case all have the same distance from the boundary surface 103a of the first module part 102. The last contact 120d is the contact with the greatest radial distance $x_{max}$ from the pivot point S. Thus, a certain closing sequence for the contacts 120, 120a, 120b, 120c, 120d can be defined. This means that this closing sequence is always maintained by the defined movement path of the pivoting movement about the pivot axis S. The control apparatus 1 or the module 100 can in particular have an output for outputting a signal, which indicates the operational readiness of the control apparatus 1 or the module 100 when, during assembly, the last contact 120d closes. Safe indication of the combined (or operationally ready) state of the module is thus achieved by taking into consideration the specific closing sequence of the contacts.

Although previously the inclined section has been described with reference to the contact-making between the first module part 102 and the second module part 104, it should be understood that the inclined section can likewise be described with reference to the contact-making between the first module part 102 and the third module part 106.

Although previously the electrical contact 120 or its outer contour with the inclined section has been described as being part of the first module part 102 in the form of the electronics module part, it should be understood that the electrical contact 120 or its outer contour with the inclined section, in particular on a printed circuit board as described above, can also be provided on the second module part 104 in the form of the bus module part described here. In this case, the inclined section can be located in the region (the leading end) of the outer contour which has the smallest radial distance from the pivot point (upper left-hand corner in the figures). In general, it should be understood that a principle reversal of the above-described concept is possible at any time.

The first and second module parts can be combined by the pivoting movement along the defined movement path. Although previously assembly or positioning of a first module part 102 by virtue of a pivoting movement onto a static (non-moving) second module part 104 has been described, it should be understood that any other type of assembly by means of a pivoting movement is possible. For example, the second module part 104 can be positioned onto a static (non-moving) first module part 102 by a pivoting movement, or both the first module part 102 and the second module part 104 can be positioned onto one another by means of a pivoting movement with respect to one another. In this context, it should be understood that a leading end of the outer contour should be understood to mean the end of the outer contour which, when considering a relative movement path between the first module part and the second module part, is closer to the respective other module part.

Although previously a control apparatus for the automated control of a technical installation has been described, it should be understood that the control apparatus can also be used for controlling another application. Furthermore, the control apparatus can be any other apparatus in which electrical contacts of a first module part and mating contacts of a second module part are combined (by pivoting movement).

What is claimed is:

1. A control apparatus for the automated control of a technical installation, comprising:
    at least one module having at least a first module part and a second module part, which can be mechanically and electrically combined to form a combined arrangement,
    wherein the first module part and the second module part each comprise a housing, each housing having a boundary surface,
    wherein the boundary surfaces are opposite one another in the combined arrangement such that a boundary plane is defined,
    wherein the first module part has a pivoting holder element on which the second module part is detachably held, the pivoting holder element defining a pivot point with a pivot axis such that the first module part and the second module part can be combined by a pivoting movement along a defined movement path around the pivot axis to form the combined arrangement,
    wherein the pivot axis defines a pivot axis plane perpendicular to the boundary plane and parallel to the pivot axis,
    wherein one of the module parts has a number of contacts comprising a first electrical contact, and wherein the other module part has a number of corresponding mating contacts comprising a first mating contact,
    wherein, in the first combined arrangement, each electrical contact makes contact with its corresponding mating contact for electrical connection between the first and the second module parts,
    wherein the contacts each are conductor tracks on a non-conductive board such that a printed circuit board is formed,
    wherein the first electrical contact has an exposed contact area defined by a first outer contour and comprising a leading end with respect to the movement path, and
    wherein the first outer contour, in the combined arrangement, comprises at least one section which is inclined towards the pivot axis plane at least at the leading end.

2. The control apparatus of claim 1, wherein the inclined section comprises at least one curvature.

3. The control apparatus of claim 1, wherein the inclined section comprises at least one straight line.

4. The control apparatus of claim 1, wherein the first outer contour is a four-sided or five-sided outer contour.

5. The control apparatus of claim 4, wherein the inclined section is a straight side of the four-sided or five-sided outer contour.

6. The control apparatus of claim 4, wherein the inclined section is a curved side of the four-sided or five-sided outer contour.

7. The control apparatus of claim 1, wherein the exposed contact area comprises a plurality of contact areas which are insulated from one another.

8. The control apparatus of claim 1, wherein the number of corresponding mating contacts comprises a second mating contact arranged next to the first mating contact in an outward radial direction from said pivot axis, said second mating contact having an exposed contact area which is defined by a second outer contour, wherein the first outer contour has a maximum radial distance from the pivot point and the second outer contour has a minimum radial distance from the pivot point during the pivoting movement, said maximum radial distance being smaller than said minimum radial distance.

9. The control apparatus of claim 1, wherein the number of contacts comprise a plurality of contacts each with an inclined section, said inclined sections differing with increasing radial distance from the pivot point.

10. The control apparatus of claim 1 wherein the number of contacts comprise a plurality of contacts and the number of corresponding mating contacts comprise a plurality of corresponding mating contacts, wherein the first module part and the second module part are designed in such a manner that the plurality of contacts and the plurality of corresponding mating contacts close one after the other in the course of the pivoting movement.

11. The control apparatus of claim 10, further comprising an output for outputting a signal, when the plurality of contacts and the plurality of corresponding mating contacts have properly closed one after the other.

12. The control apparatus of claim 1, wherein the second module part comprises a cutout, into which the pivoting holder element of the first module part can engage such that the second module part is detachably held.

13. The control apparatus of claim 1, wherein the number of mating contacts each extend in a direction parallel to the pivot axis plane.

14. In a control apparatus for the automated control of a technical installation, comprising at least one module having a first module part and a second module part, which are mechanically and electrically combined to form a combined arrangement, a module part being configured to be used as the first module part and comprising:
    a housing having a boundary surface and defining a boundary plane,
    a pivoting holder element on which the second module part can be detachably held, the pivoting holder element defining a pivot point with a pivot axis such that the first module part and the second module part can be combined by a pivoting movement along a defined movement path around the pivot axis to form the combined arrangement, the pivot axis defining a pivot axis plane perpendicular to the boundary plane and parallel to the pivot axis, and
    a number of conductor tracks arranged on a printed circuit board and forming contacts comprising a first electrical contact for making contact with a first mating contact of said second module part,
    wherein the first electrical contact has an exposed contact area defined by a first outer contour and comprising a leading end with respect to the movement path, and
    wherein the first outer contour comprises at least one section which is inclined towards the pivot axis plane at the leading end.

* * * * *